(12) United States Patent
Reshef et al.

(10) Patent No.: US 8,203,111 B2
(45) Date of Patent: Jun. 19, 2012

(54) CMOS IMAGE SENSOR PIXEL WITH AN NMOS CHARGE AMPLIFIER

(75) Inventors: Raz Reshef, Tel-Aviv (IL); Amos Fenigstein, Haifa (IL); Tomer Leitner, Nahariya (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 540 days.

(21) Appl. No.: 12/409,436

(22) Filed: Mar. 23, 2009

(65) Prior Publication Data

US 2010/0237228 A1    Sep. 23, 2010

(51) Int. Cl.
    *H03F 3/08* (2006.01)
(52) U.S. Cl. ............ 250/214 A; 250/208.1; 250/214.1; 250/214 DC; 348/303; 348/304; 257/431
(58) Field of Classification Search ............ 250/208.1, 250/214 A, 214.1, 214 R, 214 DC; 348/298, 348/302–304
    See application file for complete search history.

(56) References Cited

U.S. PATENT DOCUMENTS

| | | | |
|---|---|---|---|
| 5,742,047 A * | 4/1998 | Buhler et al. | 250/214 R |
| 5,774,181 A | 6/1998 | Shyu et al. | |
| 6,351,283 B1 | 2/2002 | Liu | |
| 7,800,673 B2 * | 9/2010 | Sugawa et al. | 348/308 |
| 2006/0146159 A1 * | 7/2006 | Farrier | 348/308 |
| 2006/0237631 A1 * | 10/2006 | Koyama | 250/214 A |
| 2008/0018764 A1 * | 1/2008 | Mizoguchi | 348/308 |

FOREIGN PATENT DOCUMENTS

WO    WO2005/101816    * 10/2005

OTHER PUBLICATIONS

Kemna et al.: "Low Noise, Large Area CMOS X-Ray Image Sensor for C.T. Application", 2003 IEEE, 0-7803-8133-5/03, pp. 1260-1265.

* cited by examiner

*Primary Examiner* — Francis M Legasse, Jr.
(74) *Attorney, Agent, or Firm* — Bever, Hoffmna & Harms, LLP; Patrick T. Bever

(57) ABSTRACT

A CMOS image sensor in which each column of pixels is connected to a signal line that is coupled to a current source, and each pixel includes a charge amplifier having a common source configuration arranged such that a charge generated by its photodiode is amplified by the charge amplifier and transmitted to readout circuitry by way of the signal line. In one embodiment the charge amplifier utilizes an NMOS transistor to couple the photodiode charge in an inverted manner to the signal line while converting the charge to a voltage through a capacitor coupled between the signal line and photodiode (i.e., forming a feedback of the NMOS amplifier transistor).

11 Claims, 6 Drawing Sheets

CMOS IMAGE SENSOR PIXEL WITH AN NMOS CHARGE AMPLIFIER

FIELD OF THE INVENTION

This invention relates to CMOS image sensors, and more particularly to CMOS image sensors having large pixel arrays that are used, for example, in medical applications.

BACKGROUND OF THE INVENTION

Sensor arrays are used, for example, in video cameras, and generally include a two dimensional array of pixels that is fabricated on a substrate. Each pixel includes a sensing element (e.g., a photodiode) that is capable of converting a portion of an optical (or other radiant source) image into an electronic (e.g., voltage) signal, and access circuitry that selectively couples the sensing element to control circuits dispose on a periphery of the pixel array by way of address and signal lines. In CMOS image sensors, which represent one type of sensor array, metal address and signal lines are supported in insulation material that is deposited over the upper surface of a semiconductor substrate, and positioned along the peripheral edges of the pixels to allow light to pass between the metal lines to the sensing elements through the insulation material. As with other sensor arrays, CMOS image sensors typically contain millions of pixels which transform photons coming from a photographed scene into millions of corresponding voltage signals, which are stored on a memory device and then read from the memory device and used to regenerate the optical image on, for example, a liquid crystal display (LCD) device.

Large area sensor arrays are used for medical imaging applications, and have many requirements that are not always applicable to "normal" (e.g., video camera) sensor arrays. First, large area image sensors must have pixel arrays that area much larger than "normal" arrays, both in the sense that the pixels are larger and total array area is very large. Second, large area sensor arrays must be able to operate in both a high resolution, low frame rate operating mode (e.g., to facilitate x-ray imaging) and in a low resolution, high frame rate operating mode (e.g., to facilitate scanning operation). In addition, high end analog performance such as noise and linearity is required. Finally, the cost of the large area sensor arrays must be minimal without performance compromise.

Conventional large area image sensors for medical x-ray applications are currently produced using a-Si:H technology and CMOS technology. Active Pixel TFT arrays that utilize a-Si:H technology typically include a 1T pixel including a photo-diode and a single transfer transistor. The TFT pixels typically transfer their charges to an off-chip charge amplifier (e.g., using one amplifier per column). A problem with this approach is that large arrays are sensitive to signal noise, and it is not possible using current a-Si:H technology to integrate a charge amplifier at the pixel level.

Large area CMOS image sensors overcome the problems associated with sensors that use a-Si:H technology in that the CMOS process allows for the inclusion of amplifier circuits within each pixel. However, some conventional large area CMOS image sensors utilize pixel level amplifiers that are formed in an integrator configuration, i.e., such that there is a current source per integrator. Therefore, a problem with this conventional large area CMOS image sensor approach is that power consumption may be too high for practical large pixel array applications. Other MOS based large area image sensors use charge amplifiers having complex circuitry and control signals that degrade production yields and, as a result, profitability. In addition, this complex circuitry reduces pixel fill-factor, which means less light will be collected and SNR will be degraded.

What is needed is a low cost, large area CMOS image sensor with high end analog performance that overcomes the problems associated with conventional large area image sensors.

SUMMARY OF THE INVENTION

The present invention is directed to a CMOS image sensor in which each pixel is coupled to a current source by way of a column signal line, and includes an internal charge amplifier that utilizes the supplied column current to amplify a charge generated on a photodiode in response to a received image portion. In particular, the photodiode charge is coupled in an inverted manner to the signal line while being converted to voltage by a capacitor coupled between the signal line and the photodiode (i.e., such that the capacitor forms a feedback of the common source amplifier). By implementing the charge amplifier utilizing a common source configuration, the resulting amplifier circuit is made small and simple, thereby maximizing pixel fill-factor and reducing yield loss. By utilizing one current source per column of pixels, the present invention reduces power consumption over conventional large area arrays that use integrator-type amplifier circuits. Accordingly, the present invention provides an arrangement that is suitable for producing low cost, large area, high resolution CMOS image sensors having high end analog performance (i.e., low noise and high linearity) that are optimal, for example, for use in medical applications.

In accordance with an embodiment of the present invention, the charge amplifier includes an NMOS transistor that is coupled between the signal line and ground by way of a select transistor. By referencing both the photodiode and the NMOS amplifier transistor to the same local ground potential, the gate-to-source noise in the NMOS amplifier transistor is made very low, thereby facilitating high end analog performance.

In accordance with another embodiment of the present invention, the charge amplifier includes at least one MOS capacitor that is coupled between the signal line and the photodiode (i.e., between the gate and drain of the NMOS amplifier transistor). In one specific embodiment, multiple MOS capacitors are connected in a back-to-back (parallel) arrangement. By utilizing at least one MOS capacitor between the signal line and the photodiode in each pixel, the present invention provides excellent pixel output voltage linearity, compared to conventional pixels that use diode capacitance for charge integration, thereby facilitating high end analog performance.

In accordance with a disclosed specific embodiment of the present invention, each pixel includes minimal internal circuitry that operates in conjunction with the select transistor to facilitate pre-integration, integration and readout operating phases. The internal circuitry includes a pull-up transistor connected between the system voltage ($V_{DD}$) and the gate terminal of the NMOS (amplifier) transistor, a transfer gate transistor connected between the photodiode and the gate terminal of the NMOS (amplifier) transistor, and a reset transistor is connected in parallel with the charge amplifier between the select transistor and the gate terminal of the NMOS (amplifier) transistor. During the pre-integration phase, all of the select transistor, transfer gate transistor, and reset transistor are turned on, thereby opening a path between the signal line and the photodiode to facilitate charging (resetting) the photodiode charge using a voltage generated across the NMOS amplifier transistor (i.e., the gate-to-source voltage of the common source NMOS transistor, which operates as a diode when the reset transistor is turned on to couple the gate and source of the NMOS transistor to the column current source). At the beginning of the integration phase, the transfer gate transistor is turned off to isolate the photodiode, causing the photodiode charge to decrease at a rate proportional to the amount of received light (i.e., relatively bright light causes a relatively rapid discharge, while relatively low light causes a relatively slow discharge). The select and reset transistors are turned off during the integration phase, and the pull-up transistor is turned on, thereby turning on the NMOS transistor to prevent leakage through the transfer gate during the integration portion of the readout operation. In one embodiment, the pull-up transistor is an NMOS transistor, and the select transistor is formed using an NMOS transistor connected in parallel with a PMOS transistor, where a select control signal is applied to the gate terminal of said NMOS transistor, and an inverse of said select control signal is applied to both a gate terminal of said PMOS transistor and to the NMOS pull-up transistor. The entire internal pixel circuitry is thus made small and simple, thereby maximizing pixel fill-factor and reducing yield loss. Near the end of the integration phase, the select transistor is turned on to re-activate the charge amplifier. The reset transistor is then turned on and a "reset level" signal (i.e., the signal generated by the charge amplifier absent the influence of the photodiode charge) is externally sampled. The readout phase then begins by turning off the reset transistor and turning on the transfer gate transistor to transfer the remaining photodiode charge from the photodiode to the capacitor and the gate terminal of the NMOS (amplifier) transistor. The output of the pixel is now at "signal level" and is sampled by readout circuitry connected to the signal line (i.e., external to the pixel). The readout circuitry then determines the final pixel value by determining a difference between the "signal level" value and the "reset level" value.

According to another embodiment of the invention, each pixel includes multiple photodiodes that are coupled to the one or more MOS capacitors of the charge amplifier by associated transfer gates. This arrangement facilitates reading one photodiode at a time, or analog binning of two or more diodes, thus allowing for a dual application of the CMOS image sensor (i.e., either low resolution, high frame rate applications or high resolution applications). The photodiodes are fabricated using a large area format to improve fill-factor, but because the photodiode charge is integrated on the capacitor in feedback of the charge amplifier, high sensitivity is still obtained.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improvement in CMOS image sensors, and more particularly to large area image sensor arrays. The following description is presented to enable one of ordinary skill in the art to make and use the invention as provided in the context of a particular application and its requirements. The terms "coupled" and "connected", which are utilized herein, are defined as follows. The term "connected" is used to describe a direct connection between two circuit elements, for example, by way of a metal line formed in accordance with normal integrated circuit fabrication techniques. In contrast, the term "coupled" is used to describe either a direct connection or an indirect connection between two circuit elements. For example, two coupled elements may be directly connected by way of a metal line, or indirectly connected by way of an intervening circuit element (e.g., a capacitor, resistor, inductor, or by way of the source/drain terminals of a transistor). Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
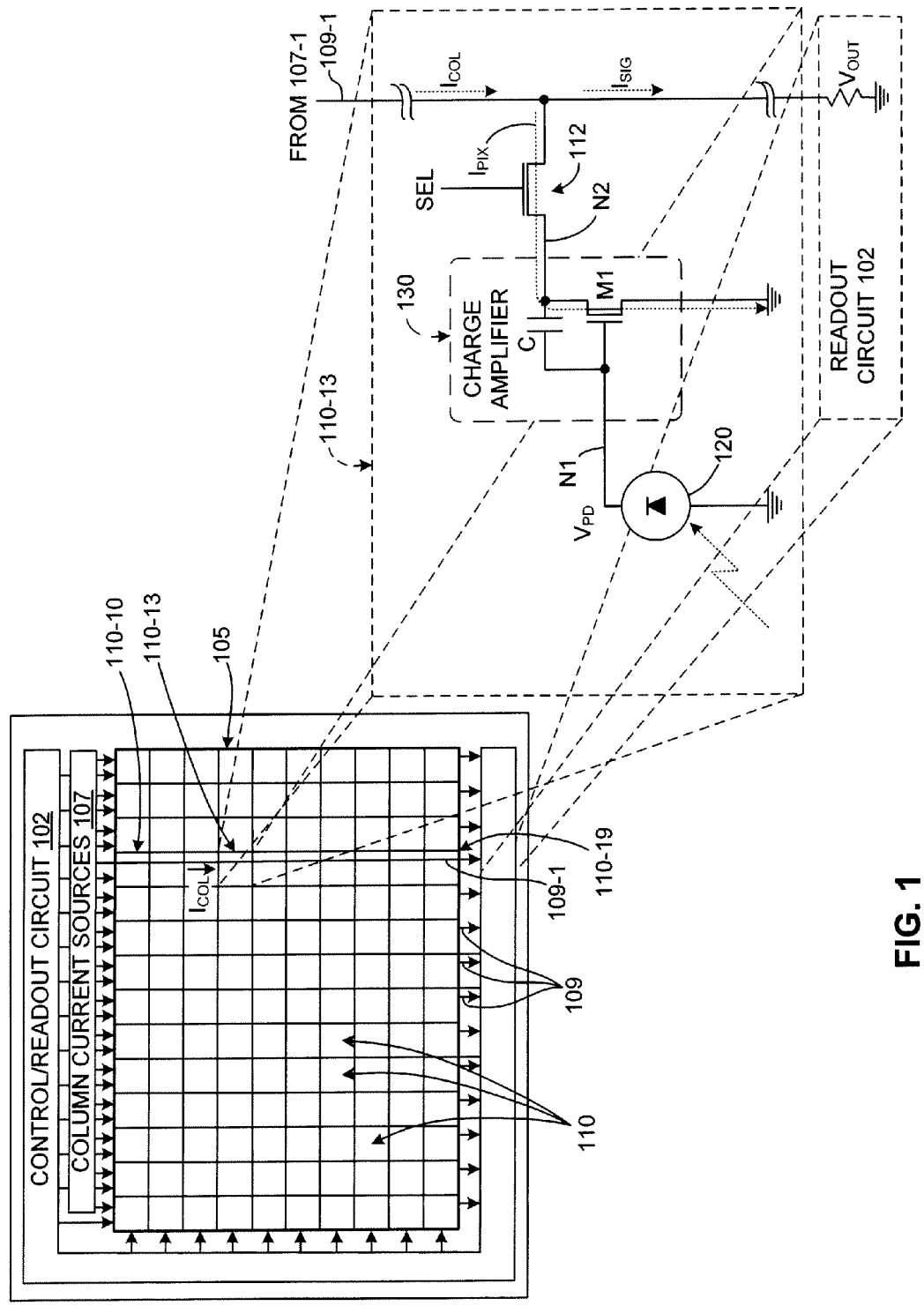
FIG. 1 is a simplified perspective diagram showing a CMOS image sensor according to an embodiment of the present invention.

FIG. 1 is a simplified diagram showing a CMOS image sensor 100 formed in accordance with a generalized embodiment of the present invention. CMOS image sensor 100 is similar to conventional CMOS image sensors in that it includes a pixel array 105 including pixels 110 arranged in rows and columns, and control/readout circuitry 102 that access, control and process signals received from each of the pixels by way of associated metal lines passing between the rows and columns of pixels 110. A simplified pixel 110-13, which is exemplary of all pixels 110, is shown in an enlarged fashion in the lower right portion of FIG. 1. Similar to conventional CMOS image sensors, each pixel 110 of CMOS image sensor 100 (e.g., pixel 110-13 includes at least one CMOS photodiode 120 and at least one select transistor (switch) 112. CMOS photodiode 120 is fabricated on a semiconductor (e.g. silicon) substrate using known techniques, and is controlled by reset circuitry and other control circuitry (omitted from FIG. 1 for illustrative purposes) to generate a voltage $V_{PD}$ at a first node N1 during read operations (described below). Select transistor 112 is connected between a signal line 109-1 and a second internal node N2 of pixel 110-13, and receives a select control signal SEL during the read operations that couples node N2 to signal line 109-1. The read operations mentioned above are initiated using select control signals and other control signals generated by control/readout circuit 102 according to timing characteristics described in further detail below, and transmitted to pixels 110 utilizing addressing schemes understood by those skilled in the art.

According to an aspect of the present invention, CMOS image sensor 100 differs from conventional CMOS image sensors in that column sources 107 supply a fixed column current on each associated column signal line 109, and each pixel 110 includes an internal charge amplifier 130 that utilizes a common source configuration in which the supplied column current is used to amplify a charge generated by photodiode 120 at node N1, and to transmit the amplified charge signal by way of the associated column signal lines 109 to control/readout circuit 102. For example, pixels 110-11, 110-13 and 110-19 form a column that receives column current $I_{COL}$ by way of associated column signal line 109-1, with pixel 110-13 shown in the lower right portion of FIG. 1. Charge amplifier 130 of pixel 110-13 is coupled between nodes N1 and N2, and operates such that, during a read operation in which select switch 112 is turned on to allow current flow between signal line 109-1 and node N2, a photodiode charge $V_{PD}$ generated at node N1 produce a corresponding amplified output signal $V_{OUT}$ in an associated portion (represented by a resistor in FIG. 1) of control/readout circuit 102. With this arrangement, for example, when a relatively small amount of light is received by photodiode 120, a proportionally low (or high) amplified pixel output signal $V_{OUT}$ is received by readout circuitry 102 and converted to data identifying the relatively small amount of light. Conversely, when a relatively bright light is received by photodiode 120, a corresponding a proportionally high (or low) amplified pixel output signal $V_{OUT}$ is generated that is converted by readout circuitry 102 to data identifying the relatively bright light. As illustrated by the examples set forth below, by implementing charge amplifier 130 utilizing this common source configuration, the resulting amplifier circuit is made small and simple, thereby maximizing pixel fill-factor and reducing yield loss.

According to an embodiment of the present invention, as indicated by pixel 110-13 in FIG. 1, charge amplifier 130 includes an NMOS amplifier transistor M1 connected between (second) node N2 and ground (first voltage source), with its gate terminal coupled to the first node N1, and a MOS capacitor C connected between nodes N1 and N2 (i.e., between the gate and drain terminals of NMOS amplifier transistor M1). With this particular arrangement, a charge $V_{PD}$ generated at node N1, which is determined by the amount of received light, is applied to capacitor C and the gate terminal of NMOS transistor M1. NMOS transistor M1 thus functions as an amplifier with a closed-loop capacitive feedback its source terminal (connected to ground) serving as a positive input and its gate terminal serving as a negative input terminal and "virtual ground" node. The only minor changes in gate voltage of NMOS transistor M1 are due to finite gain of the common source amplifier implemented by NMOS transistor M1. For example, to produce a given change "X" on signal line 109-1, the charge on node N1 needs to change by X/A, where A is the open loop gain of charge amplifier 130. Since the gate voltage of NMOS transistor M1 stays almost constant, the charge on node N1 is coupled in an inverted manner to node N2 while being converted to voltage through capacitor C, which is coupled between signal line and photodiode (i.e., the feedback of the common source amplifier). Thus, when a relatively small (low) amount of light is received by photodiode 120, the charge collected by photodiode 120 at node N1 remains low during the associated integration phase (described below), and is transferred by feedback capacitor C to generate a relative low output voltage $V_{OUT}$. Conversely, when a relatively bright light is received by photodiode 120, the charge collected by photodiode 120 at node N1 raises to a relatively high level during the associated integration phase, which is transferred by feedback capacitor C to generate a relatively high output voltage $V_{OUT}$. By implementing charge amplifier 130 utilizing NMOS amplifier transistor M1 configured in this manner, amplification of photodiode charge $V_{PD}$ is achieved with minimal circuitry, thereby maximizing pixel fill-factor and reducing yield loss. In addition, by referencing both photodiode 120 and NMOS transistor M1 to the same local ground potential, the gate-to-source noise in the NMOS transistor M1 is minimized, thereby facilitating high end analog performance.

Figure 2:
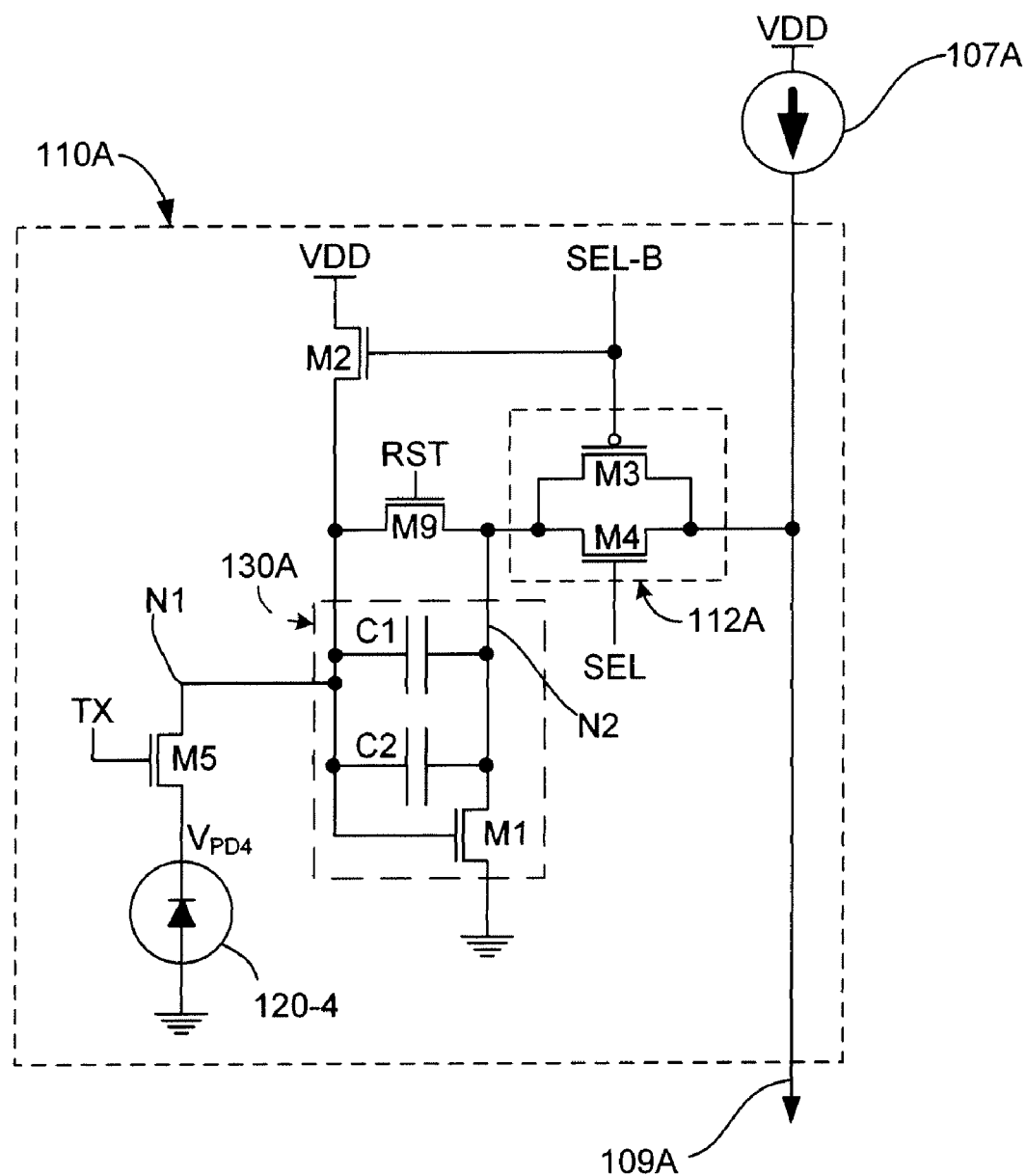
FIG. 2 is a simplified circuit diagram showing a pixel of a CMOS image sensor according to a specific embodiment of the present invention.

FIG. 2 is a simplified circuit diagram showing a pixel 110A of a CMOS image sensor formed in accordance with a specific embodiment of the present invention. Pixel 110A is utilized, for example, in place of pixel 110-13 in FIG. 1, and is addressed by corresponding control/readout circuitry similar to that described above with reference to FIG. 1. Pixel 110A includes a select switch 112A, a photodiode 120, and a charge amplifier 130A that are connected to a signal line 109A and arranged in a manner similar to that described above with reference to pixel 110-13 (described above with reference to FIG. 1), and includes internal circuitry (described below) that that operates in conjunction with the select transistor 112 to facilitate pre-integration, integration and readout operating phases, which are also described below. The additional internal circuitry of pixel 110-13 includes an NMOS pull-up transistor M2 connected between system voltage $V_{DD}$ and the gate terminal of NMOS (amplifier) transistor M1, an NMOS transfer gate transistor M5 connected between the photodiode 120 and the gate terminal of NMOS transistor M1, and an NMOS reset transistor M9 is connected in parallel with the charge amplifier between the select transistor and the gate terminal of NMOS transistor M1.

Referring to the central portion of FIG. 2, in accordance with another aspect of the disclosed embodiment, charge amplifier 130A includes two MOS capacitors C1 and C2 that are connected in a back-to-back (parallel) arrangement between the drain and gate terminals of NMOS transistor M1 (e.g., between the signal line 109-1 and photodiode 120). By including two or more MOS capacitors in this back-to-back arrangement between nodes N1 and N2, CMOS image sensors formed in accordance with present invention exhibit excellent voltage linearity on pixel output voltage $V_{OUT}$, compared to conventional pixels that use diode capacitance for charge integration, or compared to embodiments of the present invention that use a single capacitor.

The operation of pixel 110A, which is described below with reference to the timing diagrams provided in FIGS. 3(A) to 3(D), involves transmitting control signals to select switch 112A, reset transistor M9, and transfer gate transistor M5. In the present embodiment, select switch 112A is formed by an NMOS transistor M4 connected in parallel with a PMOS transistor M3, where a select control signal SEL (described below with reference to FIG. 3(C)) is applied to the gate terminal of NMOS transistor M4, and control signal SEL-B (i.e., "SEL-bar", or the inverse of control signal SEL) is applied to both the gate terminal of PMOS transistor M3 and to the NMOS pull-up transistor M2. NMOS reset transistor M9 is controlled by a reset control signal RST (described below with reference to FIG. 3(A)), and NMOS transfer gate transistor M5 is controlled by a transfer gate control signal TX (described below with reference to FIG. 3(B)).

Figure 3A:
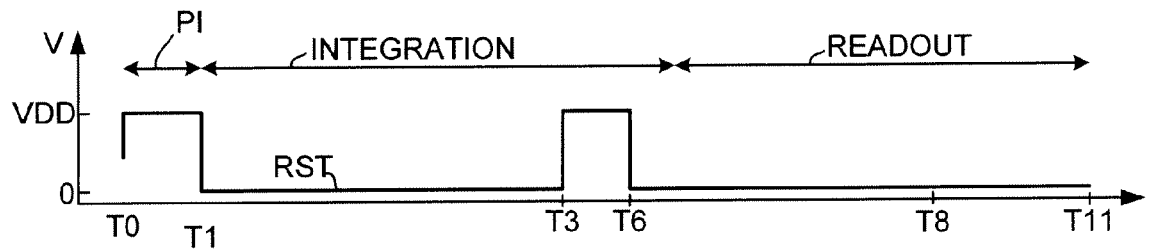
FIGS. 3(A), 3(B), 3(C) and 3(D) are timing diagrams showing control signals transmitted to the pixel of FIG. 2 during operation.

As indicated at the top of FIG. 3(A), each readout operation of pixel 110A includes a pre-integration (PI) phase, an integration phase, and a readout phase. These operating phases are described below with reference to FIGS. 4(A) to 4(D), which show corresponding operating states of the various transistors of pixel 110A during the associated operating phases.

Figure 3B:
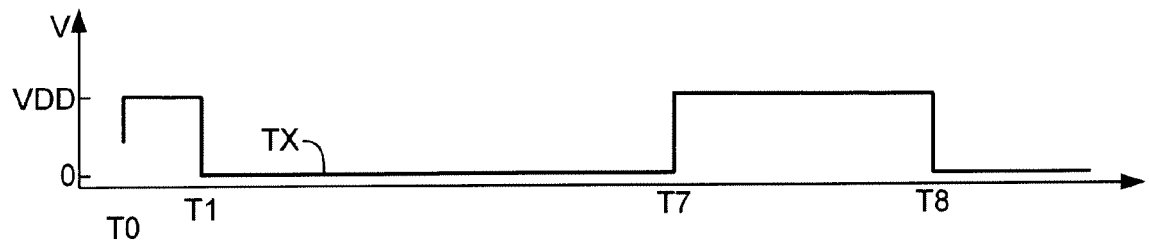
Figure 3C:
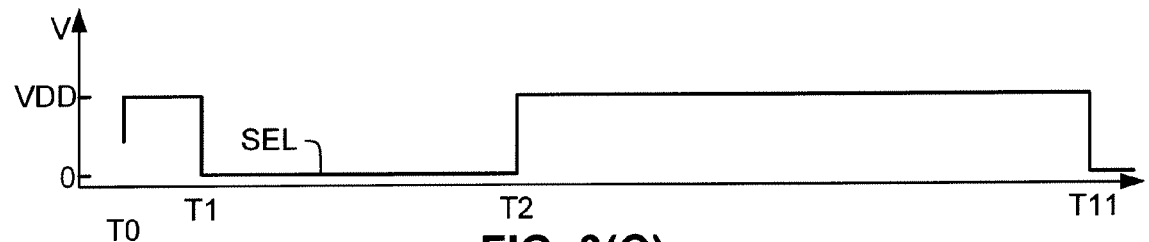
Figure 3D:
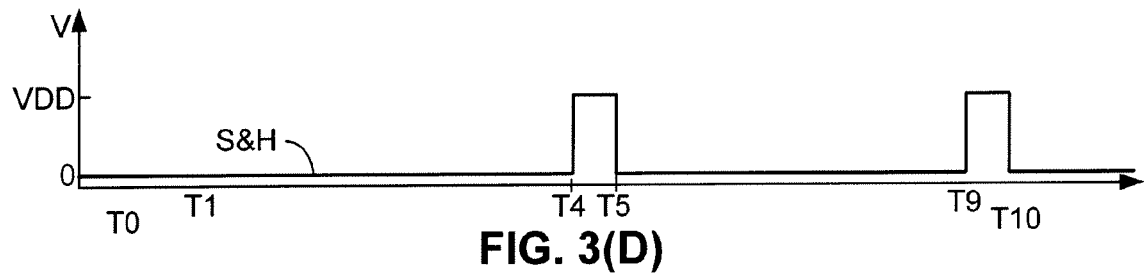
Figure 4A:
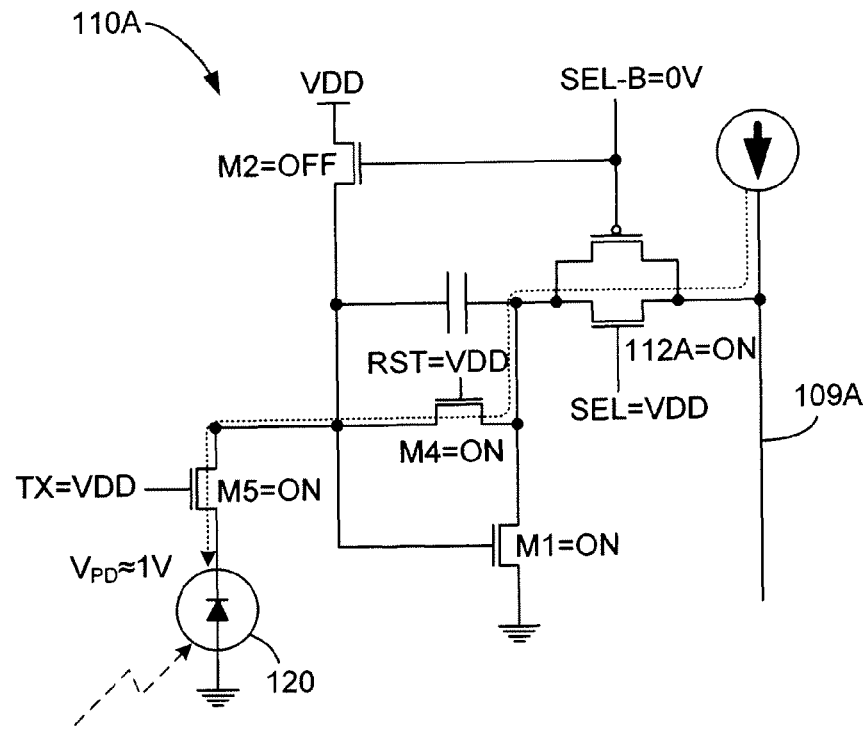
FIGS. 4(A), 4(B), 4(C) and 4(D) are simplified circuits diagram showing operating states within the pixel of FIG. 2 during operation.

Referring to the left side of FIGS. 3(A) to 3(C), during the pre-integration phase of operation (i.e., between time T0 and T1), each of reset control signal RST, transfer gate control signal TX, and select control signal SEL are toggled high. As indicated in FIG. 4(A), these high control signals cause select switch 112A, transfer gate transistor M5, and reset transistor M9 to turn on, thereby opening a path between signal line 109A and photodiode 120 that facilitates charging (resetting) photodiode 120 to diode voltage of about 1V. In this operating state, the gate and drain of NMOS transistor M1 are maintained at essentially the same voltage (i.e., there is no voltage drop across reset transistor M9), and NMOS transistor M1 functions as a diode (i.e., the gate-to-source voltage of common source NMOS transistor M1, when it is connected in diode configuration via reset transistor M9 (on) and charged by column current source 107A, generates a fixed "diode" voltage of approximately 1V at nodes N1 and N2). Note that the "diode" voltage (approximately 1V) applied to photodiode 120 during the reset phase, which is lower than VDD, provides two main advantages over conventional systems that reset using VDD or other higher voltages. First, resetting photodiode 120 is done by a limited column current, so a large current spike while resetting a row of pixels is prevented (this is especially important in large arrays). Second, as discussed below with reference to the readout phase, because the "signal level" output voltage is higher that the "reset level" output voltage (which is equal to the "diode" voltage), the low reset level provided by the "diode" voltage provides a large voltage window for signal voltage range. This large voltage range allows for a high resolution A/D circuit to sample the pixel output. Note also that the high select control signal SEL requires that inverse control signal SEL-B is low, thereby turning off pull-up transistor M2.

Figure 4B:
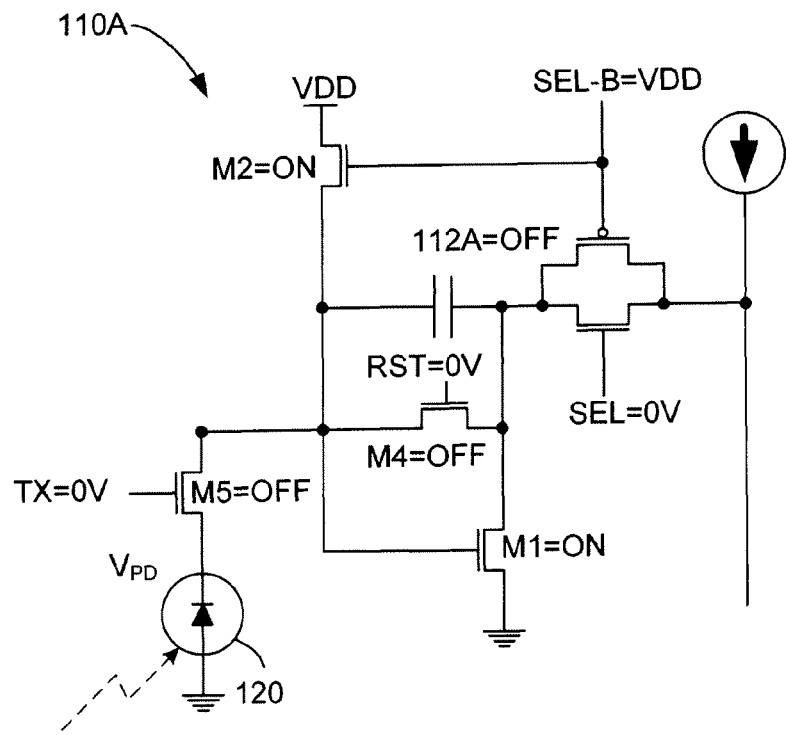

Referring again to FIGS. 3(A) to 3(C), at the beginning of the integration phase (at time T1), each of reset control signal RST, transfer gate control signal TX, and select control signal SEL are toggled low. Referring to FIG. 4(B), these low control signals cause select switch 112A, transfer gate transistor M5, and reset transistor M9 to turn off, thereby isolating photodiode 120, causing photodiode charge $V_{PD}$ to decrease at a rate proportional to the amount of received light (i.e., relatively bright light causes a relatively rapid discharge, while relatively low light causes a relatively slow discharge). In addition, with select switch 112A turned off, the pull-up transistor M2 is turned on, thereby turning on the NMOS transistor M1 to prevent leakage through the transfer gate M5 during the integration phase.

Figure 4C:
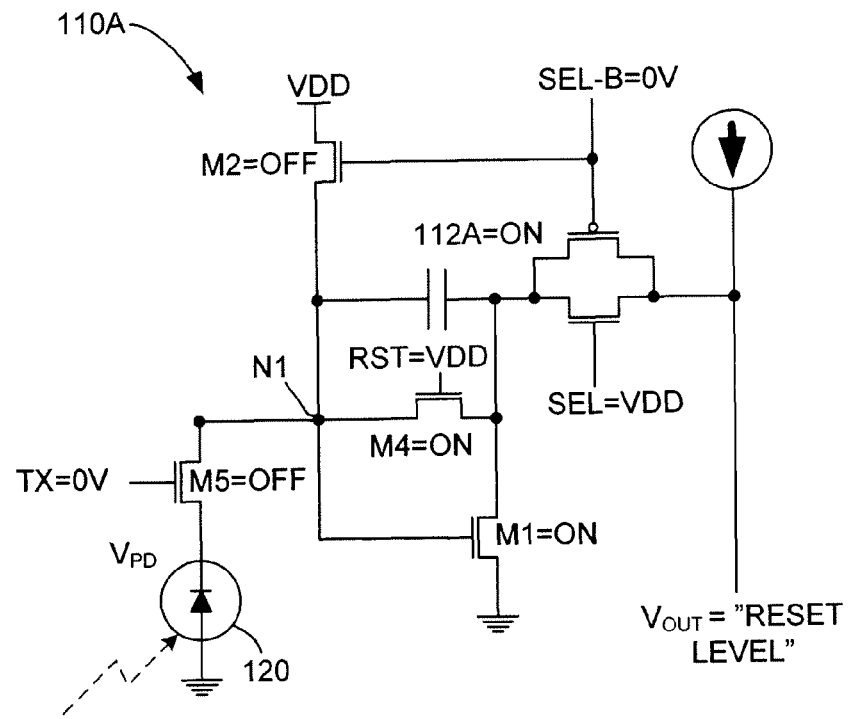
Figure 4D:
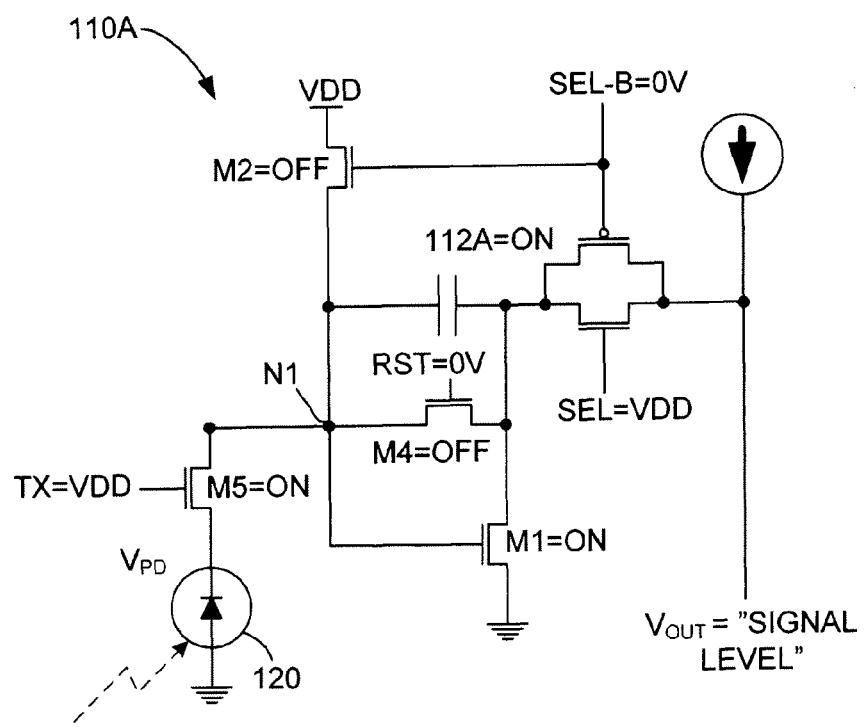

A "reset level" reading is then performed near the end of the integration phase. Referring again to FIG. 3(C), after a portion the integration phase has elapsed (i.e., at time T2), select control signal SEL toggles high to turn on select switch 112A, thereby re-activating charge amplifier 130A (i.e., coupling node N2 to signal line 109A). Note that this action causes pull-up transistor M2 to turn off. A short time later (time T3, FIG. 3(A)), reset control signal RST toggles high to turn on reset transistor M4, thereby charging gate-to-source voltage of M1 (node N1) according to the column current source level by way of select switch 112A and reset transistor M4, as depicted in FIG. 4(C). Note again that NMOS transistor M1 functions as a diode, and the pixel output voltage $V_{OUT}$ at this time is equal to the "diode" voltage (i.e., approximately 1V). The "reset level" (diode voltage) varies from pixel to pixel due to the Vt variation of NMOS transistors M1 from pixel to pixel. However, performing a reset read operation before each "signal level" read operation provides a correlated pixel value (i.e., the difference between the "signal level" value and the "reset level" value). That is, a higher "diode" voltage ("reset level" value) will result in a higher "signal level" value for the same amount of light collected by a given photodiode, and a lower "diode" voltage will result in a lower "signal level" value for the same amount of light collected by that photodiode. A first sample/hold operation is performed between time T4 and T5 (see FIG. 3(D)) while reset signal RST is asserted, and then reset control signal RST is toggled low (time T6, FIG. 3(A)).

A readout phase of the operation is then performed to read a "signal level" value associated with photodiode $V_{PD}$ stored on photodiode 120 in response to the light received during the integration phase. Referring to FIG. 3(B), transfer gate control signal TX is asserted beginning at time T7, which turns on transfer gate M5 to couple photodiode 120 to node N1 (see FIG. 4(D)). After a predetermined time period for allowing photodiode charge $V_{PD}$ to transfer to capacitor C, a second sample/hold operation is performed between time T9 and T10 to read the "signal level" value, as indicated at the lower right portion of FIG. 4(D). In one embodiment, transfer gate M5 is turned off at time T8, prior to the second sample/hold operation, to match pre-integration and post-integration channel feedthrough of transfer transistor M5. Select switch 112A is subsequently turned off (time T11; see FIG. 3(C)) to end the readout phase.

Figure 5:
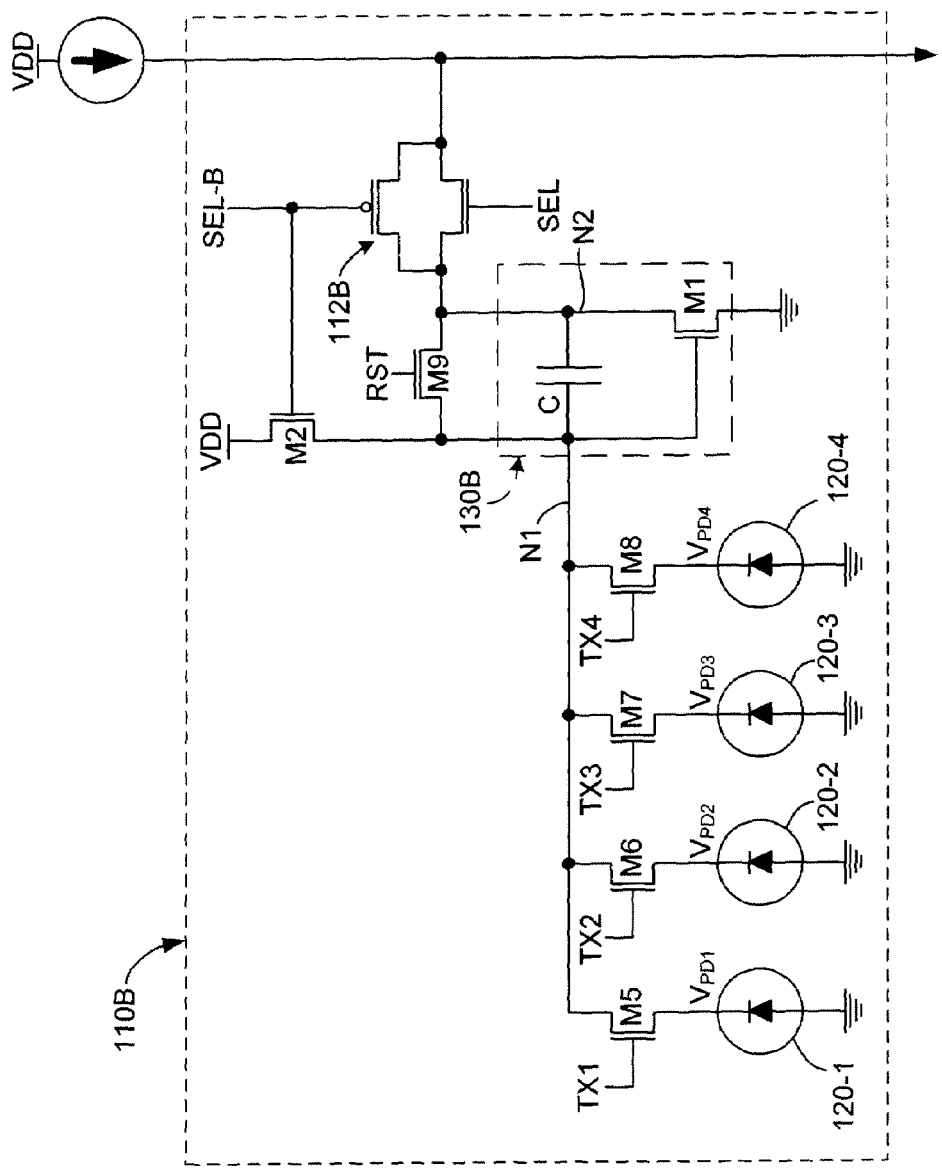
FIG. 5 is a simplified circuit diagram showing a pixel of a CMOS image sensor according to another specific embodiment of the present invention.

FIG. 5 is a simplified circuit diagram showing a pixel 110B of a CMOS image sensor formed in accordance with another specific embodiment of the present invention, and is utilized, for example, in place of pixel 110-13 in FIG. 1. Pixel 110B includes a select switch 112B, an NMOS amplifier transistor M1, an NMOS pull-up transistor M2, and a reset transistor M9 that are arranged and operate substantially as described above with reference to pixel 110A, so further description of these elements is omitted for brevity.

According to an aspect of the embodiment shown in FIG. 5, pixel 110B includes multiple photodiodes 120-1 to 120-4 that are coupled to node N1 by associated transfer gates M5 to M8. This arrangement facilitates reading one photodiode at a time (i.e., sequentially reading photodiodes 120-1 to 120-4 by sequentially turning on transfer gates M5 to M8 during four separate readout operations), or by the analog binning of two or more diodes (e.g., reading photodiodes 120-1 and 120-2 by turning on transfer gates M5 and M6 while transfer gates M7 and M8 are turned off, and then reading photodiodes 120-3 and 120-4 by turning on transfer gates M7 and M8 while transfer gates M5 and M6 are turned off), thus allowing for a dual application of the CMOS image sensor (i.e., either low resolution, high frame rate applications or high resolution applications). Photodiodes 120-1 to 120-4 are fabricated using a large area format to improve fill-factor, but because their respective photodiode charges are integrated on capacitor C, high sensitivity is still obtained.

Although the present invention has been described with respect to certain specific embodiments, it will be clear to those skilled in the art that the inventive features of the present invention are applicable to other embodiments as well, all of which are intended to fall within the scope of the present invention. For example, although the present invention is described with reference to certain charge amplifier circuit arrangements, those skilled in the art will recognize that equivalent charge amplifier circuits may be utilized that intended to fall within the spirit and scope of the claims, unless otherwise limited.

The invention claim is:
1. CMOS image sensor comprising:
at least one current source for generating a predetermined signal current on a signal line; and
a first pixel including:
at least one photodiode connected between a first voltage source and first node;

a select transistor having a first terminal connected to the signal line and a second terminal connected to a second node;

a reset transistor having a first terminal connected to the first node and a second terminal connected to the second node such that a signal path is formed between the signal line and the at least one photodiode through the select transistor and the reset transistor during a reset operation, and a charge amplifier coupled between the first node and the second node, the charge amplifier having a common source configuration arranged such that a charge generated by the at least one photodiode is amplified by the charge amplifier and transmitted onto the signal line, wherein the charge amplifier comprises an NMOS charge amplifier transistor having a first terminal connected to the second node, a second terminal connected to the first voltage source, and a gate terminal coupled to the first node, wherein the first pixel further comprises a transfer transistor connected between the at least one photodiode and the first node, wherein the first pixel further comprises a pull-up transistor connected between a second voltage source and the gate terminal of the NMOS charge amplifier transistor, and wherein the CMOS image sensor further comprises means for turning on the pull-up transistor when said select transistor is turned off, whereby the pull-up transistor prevents leakage through the transfer transistor during an integration period by generating negative gate-to-source voltage on the transfer transistor during the integration period.

2. A CMOS image sensor comprising:

at least one current source for generating a predetermined signal current on a signal line; and a first pixel including:

at least one photodiode connected between a first voltage source and first node;

a select transistor connected between the signal line and a second node; and a charge amplifier coupled between the first node and the second node having a common source configuration arranged such that a charge generated by the at least one photodiode is amplified by the charge amplifier and transmitted onto the signal line, wherein the charge amplifier comprises an NMOS charge amplifier transistor having a first terminal connected to the second node, a second terminal connected to the first voltage source, and a gate terminal connected to the first node, wherein the first pixel further comprises a transfer transistor connected between the at least one photodiode and the first node, wherein the first pixel further comprises a pull-up transistor connected between a second voltage source and the gate terminal of the NMOS charge amplifier transistor, wherein the CMOS image sensor further comprises means for turning on the pull-up transistor when said select transistor is turned off, whereby the pull-up transistor prevents leakage through the transfer transistor during an integration period by generating negative gate-to-source voltage on the transfer transistor during the integration period, and wherein the select transistor comprises an NMOS transistor connected in parallel with a PMOS transistor, between the signal line and the second node, and wherein said CMOS image sensor further comprises means for transmitting a select control signal to the gate terminal of said NMOS transistor and an inverse of said select control signal to a gate terminal of said PMOS transistor.

3. The CMOS image sensor of claim 2, wherein said means for turning on the pull-up transistor comprises means for applying said inverse of said select control signal to a gate terminal of said pull-up transistor.

4. A CMOS image sensor comprising a plurality of pixels, each pixel comprising:

at least one photodiode connected between a first voltage source and first node, a select transistor connected between a signal line and a second node;

charge amplifier including an NMOS charge amplifier transistor having a first terminal connected to the second node, a second terminal connected to the first voltage source, and a gate terminal coupled to the first node;

a reset transistor between the first and second nodes, wherein the reset transistor connects the NMOS charge amplifier transistor in a diode configuration while turned on, and means for controlling the select transistor to couple the charge amplifier to the signal line during pre-integration and read-out operating periods, and to isolate the charge amplifier from the signal line during an integration operating period.

5. The CMOS image sensor of claim 4, further comprising means for generating a predetermined column voltage by charging, through a column current, a gate-to-source voltage of the NMOS charge amplifier transistor, whereby the reset transistor is turned on which connects the NMOS charge amplifier transistor in a diode configuration.

6. The CMOS image sensor of claim 4, wherein the charge amplifier further comprises one or more capacitors connected between the first node and the second node.

7. The CMOS image sensor of claim 4 wherein the first pixel further comprises a transfer transistor connected between the at least one photodiode and the first node.

8. The CMOS image sensor of claim 4, wherein the at least one photodiode comprises a plurality of photodiodes, and wherein the first pixel further comprises a plurality of transfer transistors, each of said plurality of transfer transistors being connected between an associated one of said plurality of photodiodes and the charge amplifier.

9. The CMOS image sensor of claim 7, wherein the first pixel further comprises a pull-up transistor connected between a second voltage source and the gate terminal of the NMOS charge amplifier transistor, and wherein the CMOS image sensor further comprises means for turning on the pull-up transistor when said select transistor is turned off, whereby the pull-up transistor prevents leakage through the transfer transistor during the integration period by generating negative gate-to-source voltage on the transfer transistor during the integration period.

10. The CMOS image sensor of claim 8, further comprising means for simultaneously turning on all of said plurality of transfer transistors to transfer charges from all of said plurality of photodiodes to the charge amplifier during a first operating mode, and for sequentially turning on each of said plurality of transfer transistors to transfer individual charges from each of said plurality of photodiodes to the charge amplifier during a second operating mode.

11. CMOS image sensor comprising:
an array including pixels arranged in a plurality of columns, each said column including an associated group of said pixels;
a plurality of signal lines; and
a plurality of current sources, each current source onto one of said signal lines of said plurality of signal lines,
wherein each pixel of a first associated group of said pixels is connected to an associated signal line of said plurality of signal lines, and each pixel includes:
at least one photodiode connected between a first voltage source and first node;
a select transistor connected between the associated signal line and a second node;
a charge amplifier coupled between the first node and the second node, wherein the charge amplifier includes:
an NMOS charge amplifier transistor having a first terminal connected to the second node, a second terminal connected to the first voltage source, and a gate terminal coupled to the first node, and
at least one MOS capacitor connected between the first node and the second node such that the charge generated by the at least one photodiode is coupled in an inverted manner to the second node; and
means for generating a predetermined signal voltage by charging gate-to-source voltage of NMOS charge amplifier transistor, through a column current source; and
means for controlling the select transistor to couple the charge amplifier to the signal line during pre-integration and read-out operating periods, and to isolate the charge amplifier from the signal line during an integration operating period.

* * * * *